US012080443B2

(12) United States Patent
Park et al.

(10) Patent No.: US 12,080,443 B2
(45) Date of Patent: Sep. 3, 2024

(54) PASTE FOR SOLAR CELL ELECTRODE AND SOLAR CELL USING SAME

(71) Applicant: LS-NIKKO COPPER INC., Ulsan (KR)

(72) Inventors: Kang Ju Park, Seongnam-si (KR); In Chul Kim, Yongin-si (KR); Chung Ho Kim, Namyangju-si (KR); Min Soo Ko, Seoul (KR); Mun Seok Jang, Seoul (KR); Tae Hyun Jun, Seongnam-si (KR); Hwa Joong Kim, Guri-si (KR)

(73) Assignee: LS-NIKKO COPPER INC., Ulsan (KR)

( * ) Notice: Subject to any disclaimer, the term of this patent is extended or adjusted under 35 U.S.C. 154(b) by 0 days.

(21) Appl. No.: 17/914,577

(22) PCT Filed: Dec. 29, 2020

(86) PCT No.: PCT/KR2020/019272
§ 371 (c)(1),
(2) Date: Sep. 26, 2022

(87) PCT Pub. No.: WO2021/194062
PCT Pub. Date: Sep. 30, 2021

(65) Prior Publication Data
US 2023/0207150 A1 Jun. 29, 2023

(30) Foreign Application Priority Data
Mar. 25, 2020 (KR) .................. 10-2020-0036249

(51) Int. Cl.
*H01B 1/22* (2006.01)
*H01B 3/08* (2006.01)
(Continued)

(52) U.S. Cl.
CPC ................ *H01B 1/22* (2013.01); *H01B 3/08* (2013.01); *H01B 3/185* (2013.01); *H01B 3/465* (2013.01); *H01L 31/022425* (2013.01)

(58) Field of Classification Search
CPC .... H01B 1/00; H01B 1/16; H01B 1/22; H01L 31/0224
See application file for complete search history.

(56) References Cited

U.S. PATENT DOCUMENTS 11,084,950 B2 * 8/2021 Graddy, Jr. .......... C09D 11/106
2017/0104112 A1 4/2017 Won et al.

FOREIGN PATENT DOCUMENTS

KR 1020150044944 B1 4/2015
KR 1020170068776 A 6/2017
(Continued)

OTHER PUBLICATIONS

Xu et al "Impact of Wall Slip on Screen Printing of Front-Side Silver Pastes for Silicon Solar Cells", IEEE Journal of Photovoltaics, vol. 7, No. 1, Jan. 2017.*
(Continued)

*Primary Examiner* — Mark Kopec
(74) *Attorney, Agent, or Firm* — Goldilocks Zone IP Law

(57) ABSTRACT

The present disclosure is a conductive paste for a solar cell electrode comprising a metal powder, a glass frit, and an organic vehicle, wherein the discharge amount factor A of the bus-bar electrode can be calculated by Equation 1 below, and the discharge amount factor B of the finger electrode can be calculated by the following Equation 2, and |AB| relates to a conductive paste for a solar cell electrode, characterized in that it is 0.100 or less.

$A = (\text{Slip velocity} \times 10)/(G' \times 0.01)$ [Equation 1]

$B = 1/(G'' \times 0.01)$ [Equation 2]

6 Claims, 6 Drawing Sheets

(51) Int. Cl.
    *H01B 3/18*     (2006.01)
    *H01B 3/46*     (2006.01)
    *H01L 31/0224*     (2006.01)

(56) References Cited

FOREIGN PATENT DOCUMENTS

KR      1020190075450 B1      7/2019
WO      WO/2018/150598      5/2017

OTHER PUBLICATIONS

Durairaj et al "The effect of wall-slip formation on the rheological behaviour of lead-free solder pastes", Materials and Design 31 (2010) 1056-1062.*

Yuce et al "Rheology and Screen-Printing Performance of Model Silver Pastes for Metallization of Si-Solar Cells", Coatings 2018, 8, 406; doi:10.3390/coatings8110406.*

Yuce et al "Non-volatile free silver paste formulation for front-side metallization of silicon solar cells", Solar Energy Materials and Solar Cells 200 (2019) 110040.*

\* cited by examiner

[FIG.1]
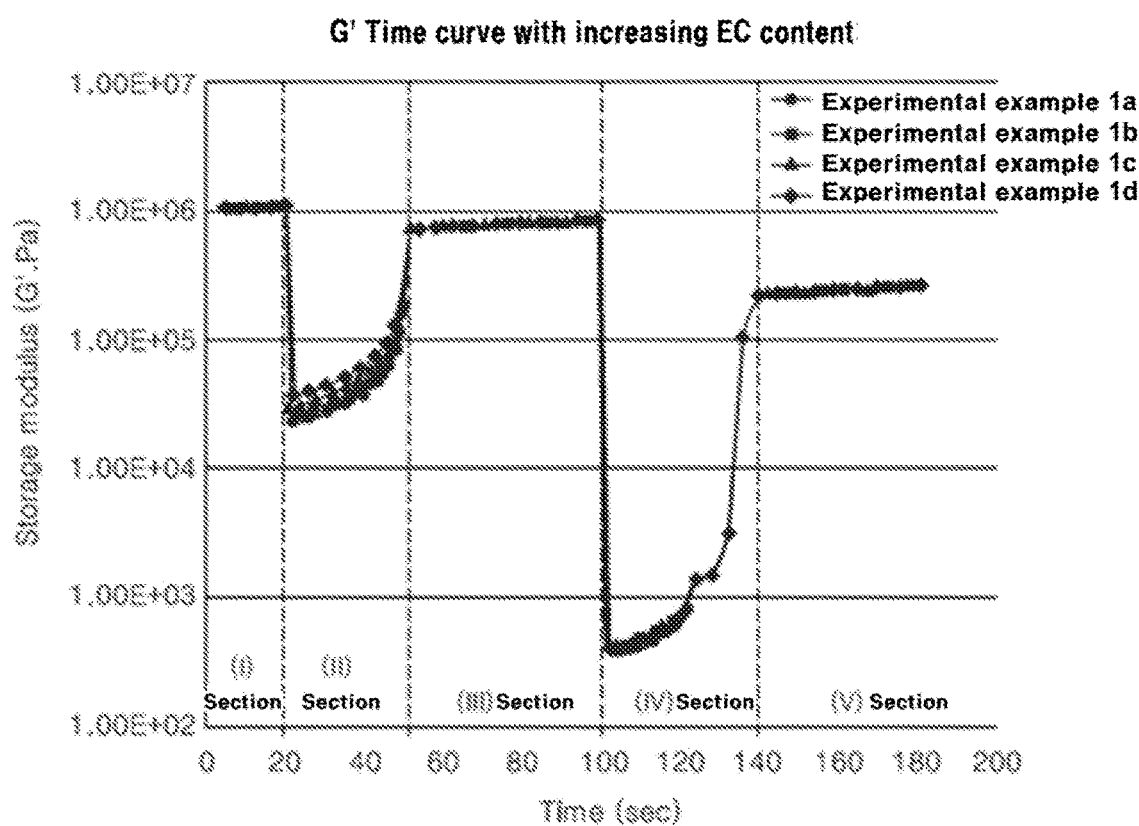

[FIG.2]
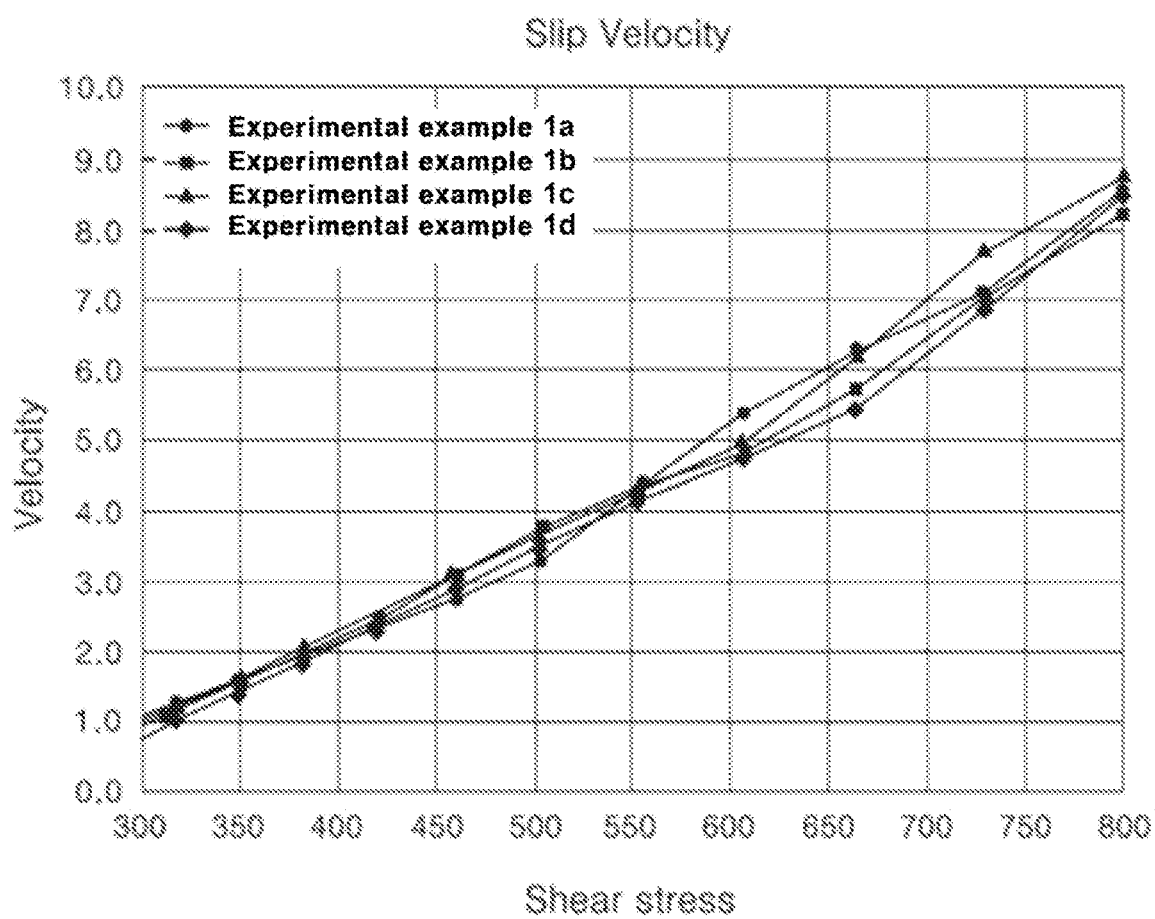

[FIG.3]
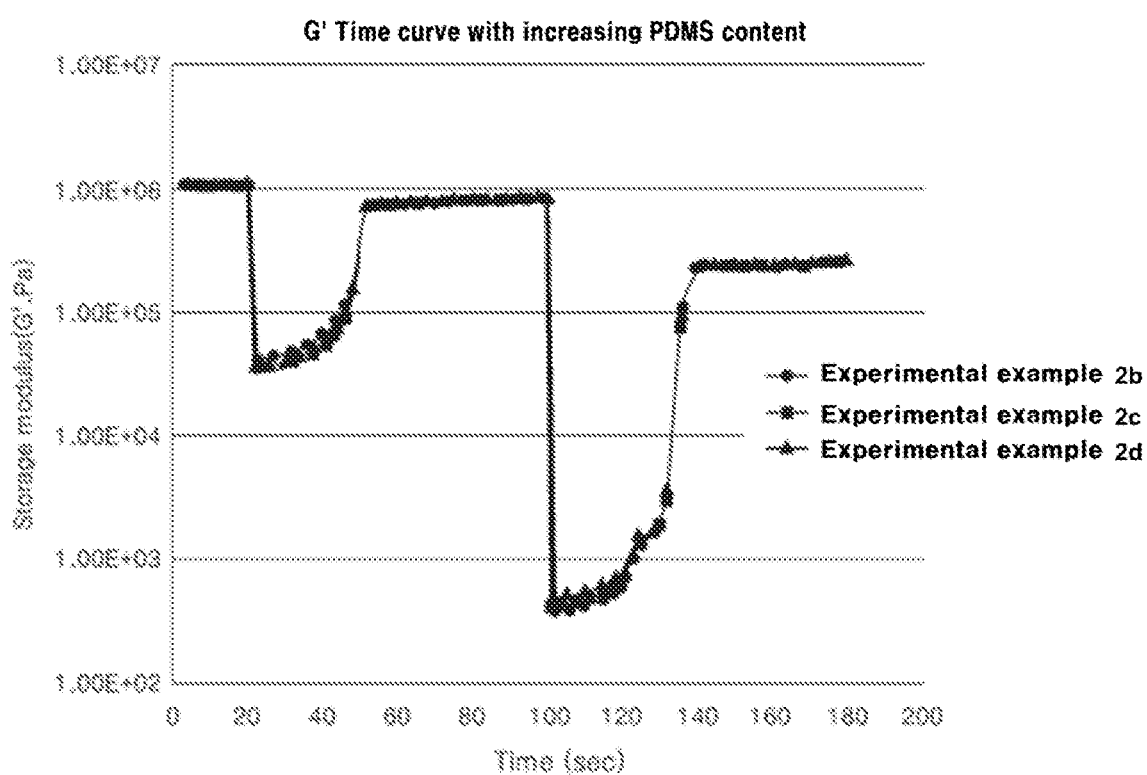

[FIG.4]
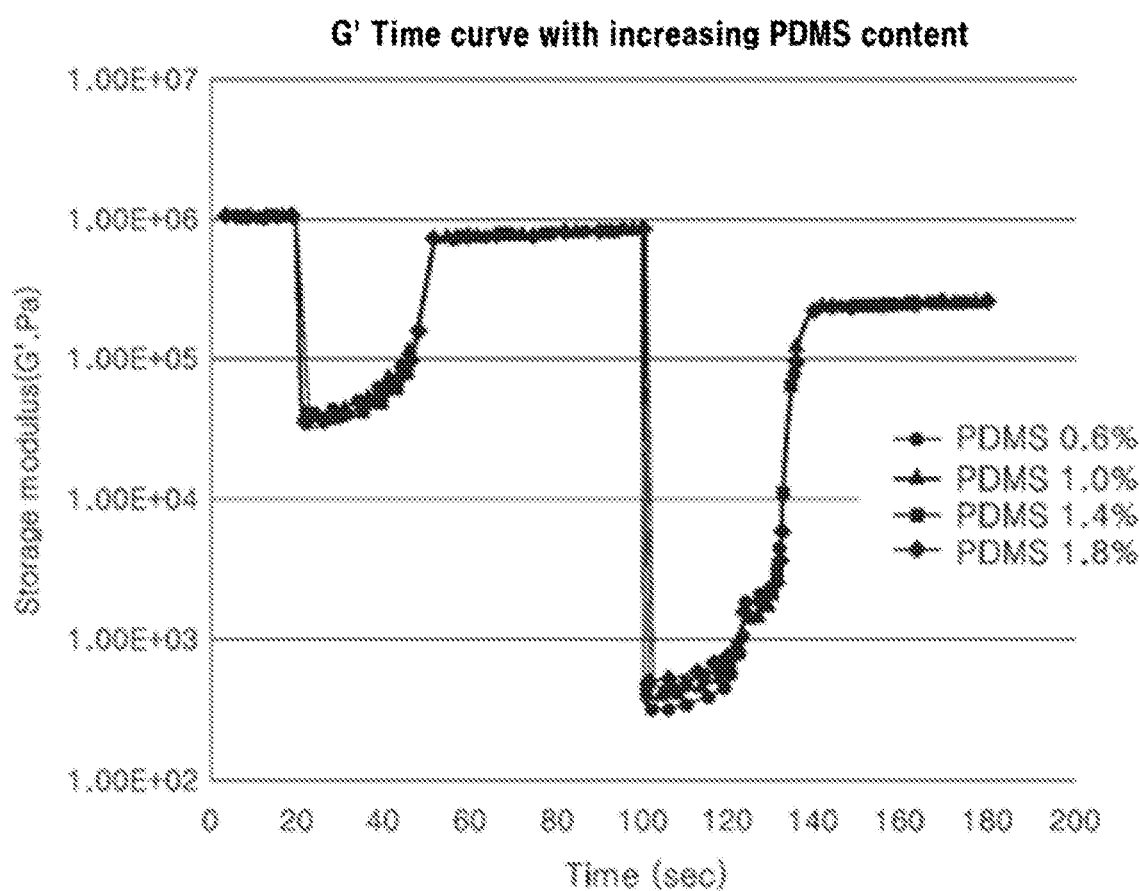

[FIG.5]
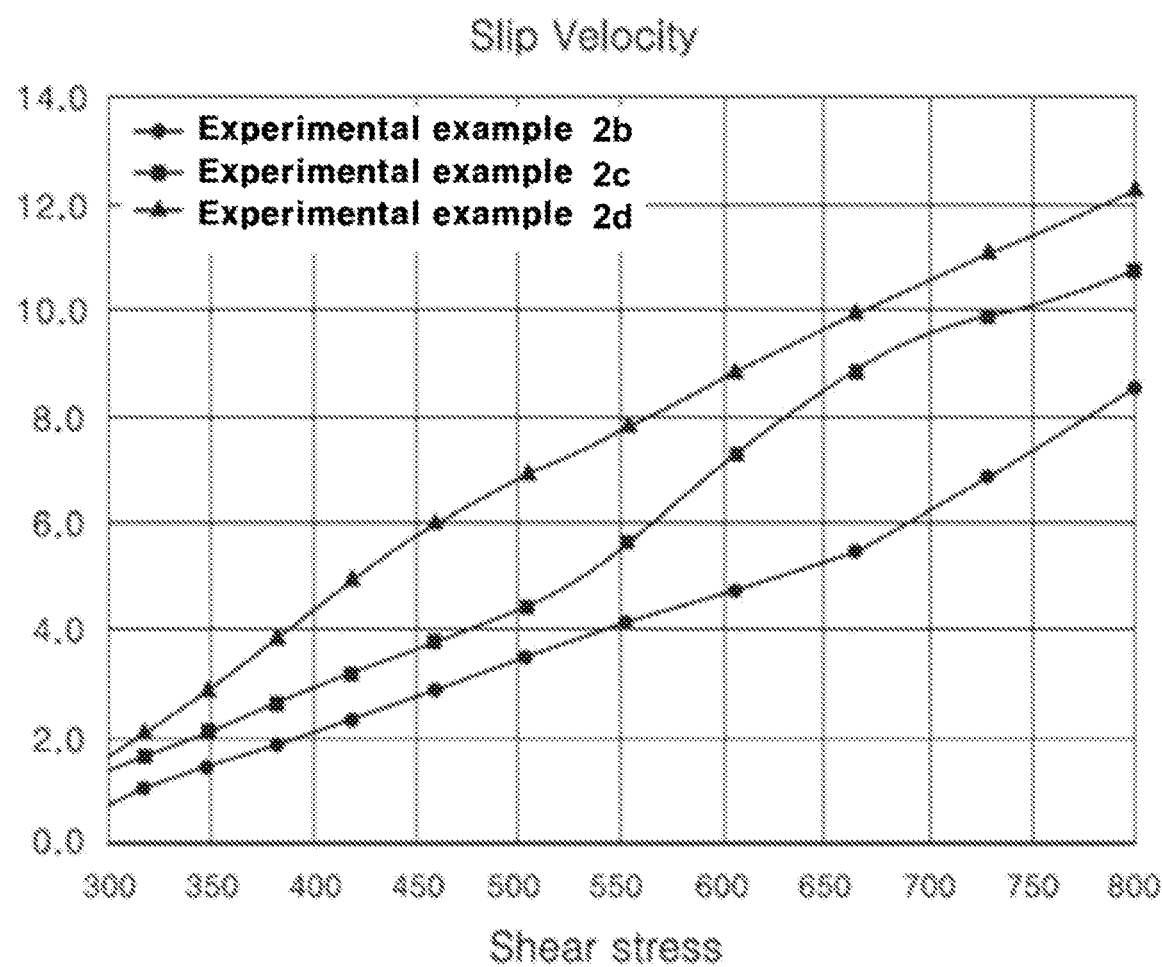

[FIG.6]
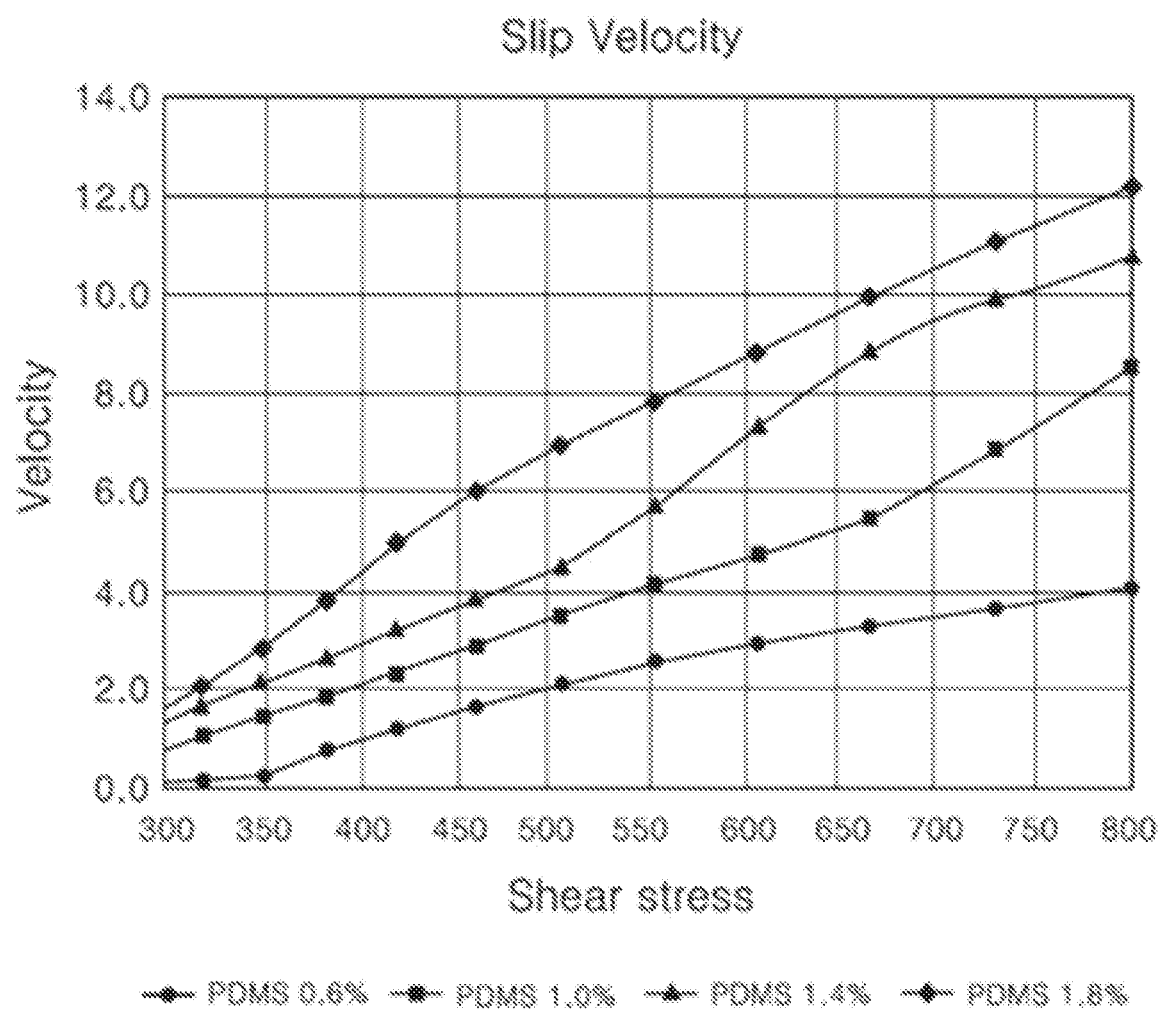

PASTE FOR SOLAR CELL ELECTRODE AND SOLAR CELL USING SAME

CROSS-REFERENCE TO RELATED APPLICATIONS

This application claims the benefit under 35 U.S.C. section 371, of PCT International Application No. PCT/KR2020/019272, filed on Dec. 29, 2020, which claims foreign priority to Korean Patent Application No. 10-2020-0036249, filed on Mar. 25, 2020, in the Korean Intellectual Property Office.

TECHNICAL FIELD

The present disclosure relates to a conductive paste used for forming an electrode of a solar cell and a solar cell manufactured using the same.

BACKGROUND ART

A conductive paste is a paste that has the application ability to form a coating film and conducts electricity to a dried or sintered coating film, and is a fluid composition dispersed with a conductive filler (metal filler) alone or a conductive filler with glass frit in a vehicle consisting of a resin-based binder and a solvent and is widely used for forming an electric circuit or an external electrode of a ceramic capacitor.

In particular, silver paste is the most chemically stable and excellent in conductivity among composite conductive pastes and thus has a wide application range in various fields such as conductive adhesion and coating and the formation of fine circuits. In electronic components that place special importance on reliability, such as printed circuit boards (PCBs), silver paste is used as an adhesive or coating material for silver through holes (STH) and is widely used as an internal electrode in a laminated condenser and recently as electrode material in a silicon-based solar cell.

However, the conductive paste, including silver, occupies a high proportion of the price of solar cell substrates. Accordingly, a method for reducing the amount of silver paste remaining in a mask has been disclosed as research to reduce the lay-down amount of the paste for the front electrode in order to reduce the cost.

However, the technology to reduce the lay-down amount of the conductive paste does not consider the variables due to the difference in the area between the bus-bar electrode and the finger electrode. If an excessive lay-down amount of the conductive paste is generated in the bus-bar electrode or the lay-down amount of conductive paste is reduced, the lay-down amount of the conductive paste at the finger electrode is severely reduced, and there are many disconnects, thereby degrading the efficiency of the manufactured solar cell.

DISCLOSURE

Technical Problem

An objective of the present disclosure is to provide a conductive paste capable of reducing cost and maintaining or improving efficiency by controlling the lay-down amount of conductive paste when printing on an electrode.

In addition, another objective of the present disclosure is to develop a factor related to the paste lay-down amount of the bus-bar electrode and a factor related to the paste lay-down amount of the finger electrode and to provide a conductive paste that provides equal or higher efficiency to reduce the paste lay-down amount by satisfying the conditions of each factor.

However, the objectives of the present disclosure are not limited to the above-mentioned objectives, and other objectives not mentioned will be clearly understood by those skilled in the art from the following description.

Technical Solution

The present disclosure includes a conductive paste including metal powder, glass frit, and an organic vehicle. Provided is a conductive paste characterized in that a lay-down amount factor A of the bus-bar electrode may be calculated by the following Equation 1, and a lay-down amount factor B of the finger electrode may be calculated by the following Equation 2, and |A−B| is 0.100 or less.

$$A = (\text{Slip velocity} \times 10)/(G' \times 0.01) \qquad [\text{Equation 1}]$$

$$B = 1/(G'' \times 0.01) \qquad [\text{Equation 2}]$$

(here, G' means the elastic value when the shear strain is 1%, and G'' means the elastic value when the shear strain is 90%)

In addition, the |A−B| is 0.050 or less.

In addition, A is 0.200 to 0.350, and B is 0.200 to 0.230.

In addition, the conductive paste includes an ethyl cellulose-based resin, and the weight of the resin is 0.12% to 0.3% by weight with respect to 100% by weight of the conductive paste.

In addition, the conductive paste includes silicone oil, and the silicone oil includes at least one selected from the group consisting of decamethyl tetrasiloxane, dodecamethyl pentasiloxane, tetradecamethyl hexasiloxane, hexadecamethyl heptasiloxane, decamethyl cyclopentasiloxane, dodecamethyl cyclohexasiloxane, tetradecamethyl cycloheptasiloxane.

In addition, the weight of the silicone oil is 0.5% to 1.5% by weight with respect to 100% by weight of the conductive paste.

Advantageous Effects

The present disclosure provides a conductive paste capable of reducing manufacturing costs by controlling the lay-down amount of the paste during electrode printing.

More specifically, the present disclosure provides a very easy effect of developing a factor related to the paste lay-down amount of the bus-bar electrode and a factor related to the paste lay-down amount of the finger electrode and providing a conductive paste equivalent to or higher efficiency by satisfying the conditions of each factor.

DESCRIPTION OF DRAWINGS

FIGS. 1 to 6 are graphs showing storage modulus measurement results of conductive pastes prepared according to an embodiment of the present disclosure.

BEST MODE

Before describing the present disclosure in detail below, it should be understood that the terms used in the present specification are for describing a specific embodiment and are not intended to limit the scope of the present disclosure, limited only by the scope of the appended patent claim. All technical and scientific terms used herein have the same meaning as commonly understood by those of ordinary skilled in the art unless otherwise stated.

Throughout the specification and claims, unless otherwise stated, the term "comprise", "comprises", and "comprising" means including the mentioned objective, step, or group of objectives and is not used to exclude any other objective, step, or group of objects or groups of objectives.

On the other hand, various embodiments of the present disclosure may be combined with any other embodiments unless clearly indicated to the contrary. Any feature indicated as particularly preferred or advantageous may be combined with any other feature and features indicated as preferred or advantageous. Hereinafter, embodiments of the present disclosure and effects thereof will be described with reference to the accompanying drawings.

In this specification, a conductive paste used to form the front electrode of a solar cell, more specifically, a paste including conductive metal powder, glass frit, and an organic vehicle, will be described as an example.

The paste, according to the present disclosure, satisfies the factor related to the paste lay-down amount of the bus-bar electrode and the factor related to the paste lay-down amount of the finger electrode and maintains an appropriate level of the paste lay-down amount to prevent disconnection of the finger electrode. It is possible to reduce an unnecessary lay-down amount of the bus-bar electrode.

More specifically, in the paste, according to the present disclosure, the lay-down amount factor A of the bus bar electrode may be calculated as a relative value through Equation 1 below, and the lay-down amount factor B of the finger electrode may be calculated as a relative value through Equation 2 below.

$$A = (\text{Slip velocity} \times 10)/(G' \times 0.01) \qquad \text{[Equation 1]}$$

$$B = 1/(G'' \times 0.01) \qquad \text{[Equation 2]}$$

(here, G' means the elasticity value when the shear strain is 1%, and G'' means the elastic value when the shear strain is 90%)

A shear strain of 1% is paste strain in a wide opening, that is, at a bus-bar electrode, and a shear strain of 90% means a paste strain in a narrow opening, that is, at a finger electrode.

The paste may be prepared such that |A−B| calculated by Equations 1 and 2 is 0.100 or less. More preferably, |A−B| may be prepared to be 0.050 or less, and most preferably, |A−B| may be prepared to be 0.010 or less. In the conductive paste manufactured to satisfy the above range, the paste amount laid-down from the bus-bar electrode is decreased, and the paste amount laid-down from the finger electrode is the same or increased so that the overall amount of paste is reduced. However, when the conductive paste is applied as a solar cell electrode using the above manner, the conversion efficiency has the same or improved.

The conductive paste, according to the present disclosure, includes an organic vehicle, and when the content of the organic binder included in the organic vehicle is changed, a conductive paste in which a small lay-down amount is consumed may be manufactured.

The type of the organic binder is not limited. Examples of the cellulose ester-based compound may include cellulose acetate, cellulose acetate butylate, or the like, and examples of the cellulose ether-based compound may include ethyl cellulose, methyl cellulose, hydroxypropyl cellulose, hydroxyethyl cellulose, hydroxypropyl methyl cellulose, hydroxyethyl methyl cellulose, and examples of the acrylic compound may include polyacrylamide, polymethacrylate, polymethyl methacrylate, polyethyl methacrylate, and examples of the vinyl-based compound may include polyvinyl butyral, polyvinyl acetate, and polyvinyl alcohol. At least one or more organic binders may be selected and used, and ethyl cellulose resin may be used most preferably.

In addition, the organic binder may be included in an amount of 0.12% to 0.3% by weight with respect to 100% by weight of the conductive paste, and specifically, may be included in an amount of 0.13% to 0.2% by weight with respect to 100% by weight of the conductive paste.

In addition, the paste according to the present disclosure, includes silicone oil, and by varying the silicone oil content, it is possible to prepare a conductive paste in which a small lay-down amount is consumed during printing.

The type of silicone oil is not limited, but it is preferable to use a linear molecule type, a branched molecule type, a cyclic molecule type, or a mixture thereof.

Specifically, examples of the linear molecule type silicone oil may include decamethyl tetrasiloxane, dodecamethyl pentasiloxane, tetradecamethyl hexasiloxane, hexadecamethyl heptasiloxane, etc., and examples of the cyclic molecule type silicone oil may include decamethyl cyclopentasiloxane, dodecamethyl cyclohexasiloxane, and tetradecamethyl cycloheptasiloxane, and the like. At least one of the silicone oils may be selected and used. In addition, the silicone oil may include at least one selected from the group consisting of phenyl trimethione, dimethicone, cyclomethicone, polydimethylsiloxane, and silicone gum, and a modified silicone oil may also be used. Preferably, the silicon oil may be polysiloxane-based such as polydimethylsiloxane, and a non-modified polysiloxane oil may be used in consideration of slip property.

In addition, it is preferable that the molecular weight of the silicone oil is 1 to 100,000 cs. When the molecular weight of the silicone oil exceeds 100,000 cs, there is a problem in that the viscosity is too high to prepare a paste.

The silicone oil is included in an amount of 0.1% to 5% by weight with respect to the total weight of the conductive paste composition. When silicone oil is added in an amount of less than 0.1% by weight, the improvement of slip characteristics is insignificant, and when silicone oil is added in an amount of more than 5% by weight, there is a problem in phase separation and storage stability. If the slip characteristic is excessive, there is a problem that the coating state during printing is poor, which may lead to disconnection. Preferably, silicone oil is included in an amount of 0.5% to 1.5% by weight.

Hereinafter, a conductive paste with a reduced discharge amount according to the present disclosure will be described through specific examples.

Specifically, the conductive paste for which the lay-down amount is expected to decrease is described using the calculated lay-down amount factor A of the bus-bar electrode and the lay-down amount factor B of the finger electrode. The predicted lay-down amount of the paste and the actual measured lay-down amount of the paste, and the power generation efficiency are compared to verify the reduction in lay-down amount of the paste according to the present disclosure.

Experimental Example 1

(1) Experimental Example 1a 85 to 95 g of silver powder, 1 to 4 g of glass frit, an organic vehicle containing 6.02 g of solvent, 0.1 to 0.4 g of dispersant, 0.1 to 0.6 g of surfactant, 0.1 to 1.2 g of additive, 0.10 g of ethyl cellulose resin, and 0.4 to 2.0 g of PDMS were mixed by planetary mixed (condition mixer) and dispersed using three roll mill to obtain a 100 g of conductive paste.

(2) Experimental Example 1b

A conductive paste was prepared in the same capacity and method as in Experimental Example 1a, except that 6.0 g of the solvent and 0.12 g of ethyl cellulose resin were added.

(3) Experimental Example 1c

A conductive paste was prepared in the same capacity and method as in Experimental Example 1a, except that 5.98 g of the solvent and 0.14 g of ethyl cellulose resin were added.

(4) Experimental Example 1d

A conductive paste was prepared in the same capacity and method as in Experimental Example 1a, except that 5.96 g of the solvent and 0.16 g of ethyl cellulose resin were added.

G', G" Measurement and Slip Velocity Measurement

The elasticity G' and G" according to shear strain were measured by five interval thixotropy test (5ITT), and the shear strain was varied in a total of 5 sections. Specifically, the 5ITT measurement conditions and measurement tool were measured at 25±1° C. using Anton Paar MCR302 and PP50/P3, and the measurement gap was 1.2 mm. In addition, the slip velocity measurement conditions and measurement tool were measured using Anton Paar MCR302 and PP50/P3 at 25±1° C., the measurement gap was 0.6 mm, and the measured shear stress was 0 to 800 Pa.

In addition, the shear strain for each section of 5ITT is as follows: section (II) represents the paste strain at the bus-bar electrode with elasticity value G' when the shear strain is 1%, and section (IV) represents the paste strain at the finger electrode with elasticity value G" when shear strain is 90%, and (I), (III), and (V) sections are elasticity values when the shear strain is 0.01%, and are introduced for accuracy of elasticity values of (II) and (IV).

FIG. 1 is a graph showing the elasticity value according to the content of ethyl cellulose resin, and FIG. 2 is a graph showing the slip velocity according to the content of the ethyl cellulose resin.

According to FIG. 1, it can be seen that as the content of the ethyl cellulose resin increases, the elasticity of section (II) increases, and all other sections are maintained constant. According to FIG. 2, it can be seen that the slip velocity is generally constant regardless of the content of the ethyl cellulose resin.

G', G", and slip velocity according to FIGS. 1 and 2, and lay-down amount factors A and B of the bus-bar electrode and the finger electrode calculated according to Equations 1 and 2 are shown in Table 1 below.

TABLE 1

| Division | Low shear strain G' (Pa) | High shear strain G" (Pa) | Slip velocity (mm/s) | Bus-bar electrode lay-down amount factor A | Finger electrode ay-down amount factor B |
|---|---|---|---|---|---|
| Experimental Example 1a | 23863 | 436.96 | 8.53 | 0.357 | 0.228 |

TABLE 1-continued

| Division | Low shear strain G' (Pa) | High shear strain G" (Pa) | Slip velocity (mm/s) | Bus-bar electrode lay-down amount factor A | Finger electrode ay-down amount factor B |
|---|---|---|---|---|---|
| Experimental Example 1b | 27305 | 439.12 | 8.22 | 0.301 | 0.227 |
| Experimental Example 1c | 31856 | 435.73 | 8.72 | 0.273 | 0.229 |
| Experimental Example 1d | 36872 | 433.58 | 8.53 | 0.231 | 0.230 |

According to FIGS. 1, 2, and Table 1, as the content of the ethyl cellulose resin increases, G' increases, and the lay-down amount factor A of the bus-bar electrode decreases, whereas the slip velocity is substantially the same, so the lay-down area of the bus-bar electrode is expected to decrease. In addition, since G" is substantially the same, the lay-down area of the finger electrode may be predicted to be the same.

When Experimental Examples 1a to 1d are actually printed on a screen mask for verification of the predicted value, a lay-down amount, a measured bus-bar electrode and finger electrode area, and the efficiency of a solar cell using a paste as an electrode are shown in Table 2 below.

TABLE 2

| Division | Lay-down amount (mg) | After printing Bus-bar electrode Measured area (um$^2$) | After printing Finger electrode Measured area (um$^2$) | Efficiency (%) |
|---|---|---|---|---|
| Experimental Example 1a | 112 | 6156 | 464.13 | 21.712 |
| Experimental Example 1b | 110 | 5922 | 463.69 | 21.752 |
| Experimental Example 1c | 108 | 5627 | 464.74 | 21.740 |
| Experimental Example 1d | 106 | 5411 | 467.52 | 21.753 |

According to Table 2, as predicted in FIGS. 1 and 2, as the content of ethyl cellulose increased, the area of the bus-bar electrode decreased, and the area of the finger electrode was the same. Thus, the lay-down amount of the whole paste decreased. On the other hand, it can be seen that the efficiency of the solar cell is improved in Experimental Examples 1b to 1d having a higher content of ethyl cellulose resin than in Experimental Example 1a.

Experimental Example 2

(1) Experimental Example 2a 85 to 95 g of silver powder, 1 to 4 g of glass frit, an organic vehicle containing 6.2 g of solvent, 0.1 to 0.4 g of dispersant, 0.1 to 0.6 g of surfactant, 0.1 to 1.2 g of additive, 0.1 to 0.4 g of ethyl cellulose resin, and 0.6 g of PDMS were mixed by planetary mixed (condition mixer) and dispersed using three roll mill to obtain a 100 g of conductive paste.

(2) Experimental Example 2b

A conductive paste was prepared in the same capacity and method as in Experimental Example 2a, except that 6.0 g of the solvent and 1.0 g of PDMS were added.

(3) Experimental Example 2b

A conductive paste was prepared in the same capacity and method as in Experimental Example 2a, except that 5.8 g of the solvent and 1.4 g of PDMS were added.

(4) Experimental Example 2c

A conductive paste was prepared in the same capacity and method as in Experimental Example 2a, except that 5.6 g of the solvent and 1.8 g of PDMS were added.

G', G" Measurement and Slip Velocity Measurement

As in Experimental Example 1, the elasticity G' and G" according to shear strain were measured by five interval thixotropy test (5ITT), and the shear strain was varied in a total of 5 sections. Specifically, the 5ITT measurement conditions and measurement tool were measured at 25±1° C. using Anton Paar MCR302 and PP50/P3, and the measurement gap was 1.2 mm. In addition, the slip velocity measurement conditions and measurement tool were measured using Anton Paar MCR302 and PP50/P3 at 25±1° C., the measurement gap was 0.6 mm, and the measured shear stress was 0 to 800 Pa.

In addition, the shear strain for each section of 5ITT is as follows: section (II) represents the paste strain at the bus-bar electrode with elasticity value G' when the shear strain is 1%, and section (IV) represents the paste strain at the finger electrode with elasticity value G" when the shear strain is 90%, and (I), (III), and (V) sections are elasticity values when shear strain is 0.01%, and are introduced for accuracy of elasticity values of (II) and (IV).

FIG. 3 is a graph showing the elasticity value according to the content of PDMS, and FIG. 4 is a graph showing the slip velocity according to the content of the PDMS.

According to FIG. 3, it can be seen that, as the content of PDMS increases, the elasticity G' of section (II) is slightly lowered or the same, and the elasticity G" of section (IV) is slightly increased or the same. It can be seen that the slip velocity increases as the content of PDMS increases.

G', G", and slip velocity according to FIGS. 3 and 4, and lay-down amount factors A and B of the bus-bar electrode and the finger electrode calculated according to Equations 1 and 2 are shown in Table 3 below.

TABLE 3

| Division | Low Shear strain G' (Pa) | High shear strain G" (Pa) | Slip velocity (mm/s) | Bus-bar electrode lay-down amount factor A | Finger electrode ay-down amount factor B |
|---|---|---|---|---|---|
| Experimental Example 2a | 36588 | 343.58 | 4.04 | 0.110 | 0.291 |
| Experimental Example 2b | 36872 | 433.58 | 8.53 | 0.231 | 0.230 |
| Experimental Example 2c | 36296 | 486.61 | 10.7 | 0.294 | 0.205 |

TABLE 3-continued

| Division | Low Shear strain G' (Pa) | High shear strain G" (Pa) | Slip velocity (mm/s) | Bus-bar electrode lay-down amount factor A | Finger electrode ay-down amount factor B |
|---|---|---|---|---|---|
| Experimental Example 2d | 36014 | 520.23 | 12.2 | 0.338 | 0.192 |

According to FIGS. 3, 4, and Table 3, it can be predicted that as the content of PDMS increases, while G' is substantially the same, the slip velocity increases, and the lay-down area of the printed bus-bar electrode increases. Also, it can be predicted that as the content of PDMS increases, G" increases, and the lay-down area of the printed finger electrode decreases.

In addition, when the content of PDMS is too small, the bus-bar electrode has a low lay-down amount factor A, which reduces the lay-down area of the bus-bar electrode, and increases the lay-down area of the finger electrode, and it is judged that the efficiency is the highest theoretically. However, the total lay-down amount is rapidly reduced, and the slip velocity is significantly lowered, causing disconnection, and thus the efficiency may be significantly reduced.

When Experimental Examples 2a to 2d are actually printed on a screen mask for verification of the predicted value, a lay-down amount, a measured bus-bar electrode and finger electrode area, and the efficiency of a solar cell using a paste as an electrode are shown in Table 4 below.

TABLE 4

| Division | Lay-down amount (mg) | After printing Bus-bar electrode Measured area (um²) | After printing Finger electrode Measured area (um²) | Efficiency (%) |
|---|---|---|---|---|
| Experimental Example 2a | 104 | 5586 | 385.37 | 21.542 |
| Experimental Example 2b | 112 | 6156 | 464.13 | 21.753 |
| Experimental Example 2c | 113 | 6386 | 431.72 | 21.712 |
| Experimental Example 2d | 113 | 6592 | 412.88 | 21.692 |

According to Table 4, in the case of Experimental Examples 2a to 2d, as predicted in FIGS. 3 and 4, the area of the bus-bar electrode actually increased as the content of PDMS increased, and the area of the finger electrode decreased or the same. Accordingly, it can be seen that the lay-down amount of the entire paste is increased. In addition, in the case of Experimental Examples 2b to 2d, it can be seen that the efficiency of the solar cell decreased in Experimental Example 2d compared to Experimental Examples 2b and 2c. In the case of Experimental Example 2a, it can be seen that the amount of PDMS was insufficient to improve the slip property during the printing of the paste, so the lay-down amount was decreased, but the efficiency was decreased due to many disconnections and short circuits.

Features, structures, effects, etc., exemplified in each of the above-described embodiments may be combined or modified for other embodiments by those of ordinary skilled in the art to which the embodiments belong. Accordingly, the contents related to such combinations and modifications should be interpreted as being included in the scope of the present disclosure.

The invention claimed is:

1. A conductive paste comprising a metal powder, glass frit, and an organic vehicle, wherein factor A is calculated by Equation 1 below, factor B is calculated by Equation 2 below, and |A−B| is 0.100 or less $$A=(\text{Slip velocity}\times 10)/(G'\times 0.01) \quad \text{[Equation 1]}$$

$$B=1/(G''\times 0.01) \quad \text{[Equation 2]}$$

(wherein, G' means the elasticity value when the shear strain is 1%, and G" means the elasticity value when the shear strain is 90%).

2. The conductive paste of claim 1, wherein the |A−B| is 0.050 or less.

3. The conductive paste of claim 1, wherein A is in a range of 0.200 to 0.350, and B is in a range of 0.200 to 0.230.

4. The conductive paste of claim 1, wherein the conductive paste comprises an ethyl cellulose-based resin, and the content of the resin is 0.12% to 0.3% by weight with respect to 100% by weight of the conductive paste.

5. The conductive paste of claim 1, wherein the conductive paste comprises silicone oil, wherein the silicone oil comprises at least one selected from the group consisting of decamethyl tetrasiloxane, dodecamethyl pentasiloxane, tetradecamethyl hexasiloxane, hexadecamethyl heptasiloxane, decamethyl cyclopentasiloxane, dodecamethyl cyclohexasiloxane, tetradecamethyl cycloheptasiloxane.

6. The conductive paste of claim 5, wherein the content of the silicone oil is 0.5% to 1.5% by weight with respect to 100% by weight of the conductive paste.

* * * * *